United States Patent
Jaiswal et al.

(10) Patent No.: US 12,352,832 B2
(45) Date of Patent: Jul. 8, 2025

(54) REDUCING ANGLE ERROR IN ANGLE SENSOR DUE TO ORTHOGONALITY DRIFT OVER MAGNETIC-FIELD

(71) Applicant: Allegro MicroSystems, LLC, Manchester, NH (US)

(72) Inventors: Samridh Jaiswal, London (GB); Paolo Campiglio, Arcueil (FR); Ronald Lehndorff, Mainz (DE); Yen Ting Liu, Hsinchu (TW)

(73) Assignee: Allegro MicroSystems, LLC, Manchester, NH (US)

( * ) Notice: Subject to any disclaimer, the term of this patent is extended or adjusted under 35 U.S.C. 154(b) by 354 days.

(21) Appl. No.: 18/161,145

(22) Filed: Jan. 30, 2023

(65) Prior Publication Data
US 2024/0255592 A1 Aug. 1, 2024

(51) Int. Cl.
*G01R 33/09* (2006.01)
*G01B 7/30* (2006.01)
*G01R 33/00* (2006.01)

(52) U.S. Cl.
CPC .............. *G01R 33/091* (2013.01); *G01B 7/30* (2013.01); *G01R 33/093* (2013.01); *G01R 33/096* (2013.01); *G01R 33/098* (2013.01); *G01R 33/0052* (2013.01)

(58) Field of Classification Search
CPC .. G01R 33/091; G01R 33/093; G01R 33/096; G01R 33/098; G01R 33/0052; G01B 7/30
USPC ........................................................ 324/252
See application file for complete search history.

(56) References Cited

U.S. PATENT DOCUMENTS

| | | |
|---|---|---|
| 5,282,104 A | 1/1994 | Coutellier et al. |
| 5,677,625 A | 10/1997 | Dieny |
| 5,686,838 A | 11/1997 | van den Berg |
| 5,821,517 A | 10/1998 | Fedeli et al. |
| 5,858,125 A | 1/1999 | Hasegawa |
| 5,895,727 A | 4/1999 | Hasegawa |
| 5,923,514 A | 7/1999 | Scott et al. |
| 5,933,306 A | 8/1999 | Santos et al. |

(Continued)

FOREIGN PATENT DOCUMENTS

| | | |
|---|---|---|
| CN | 201622299 | 11/2010 |
| CN | 101900754 | 12/2010 |

(Continued)

OTHER PUBLICATIONS

Childress et al; "Spin-Valve and Tunnel-Valve Structures with In Situ In-Stack Bias;" IEEE Transactions on Magnetics, vol. 38, No. 5; Sep. 2002; pp. 2286-2288; 3 Pages.

(Continued)

*Primary Examiner* — Raul J Rios Russo
(74) *Attorney, Agent, or Firm* — DALY, CROWLEY, MOFFORD & DURKEE, LLP (57) ABSTRACT

In one aspect, a method includes manufacturing a magnetic-field angle sensor on a wafer. The manufacturing includes forming a cosine bridge that includes forming a first magnetoresistance (MR) element. The manufacturing also includes forming a sine bridge that includes forming a second MR element. Forming the first MR element includes using a process to reduce orthogonality errors between the sine bridge and the cosine bridge caused by anisotropy present in magnetic material in the first MR element.

18 Claims, 7 Drawing Sheets

(56) References Cited

U.S. PATENT DOCUMENTS

| | | | |
|---|---|---|---|
| 6,013,365 A | 1/2000 | Dieny et al. | |
| 6,026,355 A | 2/2000 | Rahman et al. | |
| 6,069,476 A | 5/2000 | Vieux-Rochaz et al. | |
| 6,094,330 A | 7/2000 | Criniti et al. | |
| 6,141,197 A | 10/2000 | Kim et al. | |
| 6,373,247 B1 | 4/2002 | Marx et al. | |
| 6,429,640 B1 | 8/2002 | Daughton et al. | |
| 6,462,641 B1 | 10/2002 | Dieny et al. | |
| 6,490,140 B1 | 12/2002 | Mao et al. | |
| 6,522,132 B1 | 2/2003 | Vieus-Rochaz et al. | |
| 6,532,164 B2 | 3/2003 | Redon et al. | |
| 6,549,382 B1 | 4/2003 | Gill | |
| 6,556,390 B1 | 4/2003 | Mao et al. | |
| 6,603,677 B2 | 8/2003 | Redon et al. | |
| 6,738,236 B1 | 5/2004 | Mao et al. | |
| 6,770,382 B1 | 8/2004 | Chang et al. | |
| 7,095,596 B2 | 8/2006 | Schmollngruber et al. | |
| 7,106,046 B2 | 9/2006 | Nagano et al. | |
| 7,176,679 B2 | 2/2007 | Baragatti et al. | |
| 7,288,931 B2 | 10/2007 | Granig et al. | |
| 7,324,312 B2 | 1/2008 | Gill | |
| 7,324,313 B2 | 1/2008 | Childress et al. | |
| 7,342,753 B2 | 3/2008 | Gill | |
| 7,394,247 B1 | 7/2008 | Guo et al. | |
| 7,397,637 B2 | 7/2008 | Gill | |
| 7,453,672 B2 | 11/2008 | Dieny et al. | |
| 7,463,016 B2 | 12/2008 | Shoji | |
| 7,472,004 B2 | 12/2008 | Hara et al. | |
| 7,713,755 B1 | 5/2010 | Xiao | |
| 7,759,933 B2 | 7/2010 | Coillot et al. | |
| 7,813,202 B2 | 10/2010 | Rodmacq et al. | |
| 7,855,555 B2 | 12/2010 | Biziere et al. | |
| 7,902,811 B2 | 3/2011 | Shoji | |
| 7,944,205 B2 | 5/2011 | Fermon et al. | |
| 7,944,736 B2 | 5/2011 | Dieny et al. | |
| 7,999,338 B2 | 8/2011 | Zheng et al. | |
| 8,093,886 B2 | 1/2012 | Okada et al. | |
| 8,129,988 B2 | 3/2012 | Fermon et al. | |
| 8,223,463 B2 | 7/2012 | Katada et al. | |
| 8,279,666 B2 | 10/2012 | Dieny et al. | |
| 8,487,701 B2 | 7/2013 | Boujamaa et al. | |
| 8,513,944 B2 | 8/2013 | Rodmacq et al. | |
| 8,542,072 B2 | 9/2013 | Dieny et al. | |
| 8,624,590 B2 | 1/2014 | Dieny | |
| 8,669,122 B2 | 3/2014 | Viala et al. | |
| 8,779,764 B2 | 7/2014 | Meguro et al. | |
| 8,836,317 B2 | 9/2014 | Kasajima | |
| 8,847,589 B2 | 9/2014 | Walther et al. | |
| 9,529,060 B2 | 12/2016 | Fermon et al. | |
| 9,804,234 B2 | 10/2017 | Dressler et al. | |
| 9,812,637 B2 | 11/2017 | Fermon et al. | |
| 9,922,673 B2 | 3/2018 | Campiglio et al. | |
| 10,347,277 B2 | 7/2019 | Campiglio et al. | |
| 10,557,726 B2 | 2/2020 | Lassalle-Balier et al. | |
| 10,935,612 B2 | 3/2021 | Belin et al. | |
| 11,199,424 B2 | 12/2021 | Lassalle-Balier et al. | |
| 2001/0030839 A1 | 10/2001 | Zhong et al. | |
| 2002/0036315 A1 | 3/2002 | Adachi et al. | |
| 2002/0061421 A1 | 5/2002 | Dieny | |
| 2002/0158626 A1 | 10/2002 | Shay et al. | |
| 2002/0171417 A1 | 11/2002 | Schoedlbauer | |
| 2002/0186513 A1 | 12/2002 | Heinonen et al. | |
| 2002/0191348 A1 | 12/2002 | Hasegawa et al. | |
| 2003/0020471 A1 | 1/2003 | Kohlstedt | |
| 2003/0053266 A1 | 3/2003 | Dieny et al. | |
| 2003/0053270 A1 | 3/2003 | Gill | |
| 2003/0058587 A1 | 3/2003 | Hasegawa et al. | |
| 2003/0070497 A1 | 4/2003 | Kikuchi et al. | |
| 2003/0184918 A1 | 10/2003 | Lin et al. | |
| 2003/0218840 A1 | 11/2003 | Apel et al. | |
| 2003/0226409 A1 | 12/2003 | Steele et al. | |
| 2003/0235016 A1 | 12/2003 | Gill | |
| 2004/0008454 A1 | 1/2004 | Gill | |
| 2004/0056647 A1 | 3/2004 | Stauth et al. | |
| 2004/0056654 A1 | 3/2004 | Goldfine et al. | |
| 2004/0207035 A1 | 10/2004 | Witcraft et al. | |
| 2004/0263157 A1 | 12/2004 | Sudo et al. | |
| 2006/0038407 A1 | 2/2006 | Shelley et al. | |
| 2006/0077598 A1 | 4/2006 | Taylor et al. | |
| 2006/0091993 A1 | 5/2006 | Shoji | |
| 2006/0114098 A1 | 6/2006 | Shoji | |
| 2006/0152859 A1 | 7/2006 | Childress et al. | |
| 2006/0193089 A1 | 8/2006 | Li et al. | |
| 2006/0214656 A1 | 9/2006 | Sudo et al. | |
| 2007/0019338 A1 | 1/2007 | Childress et al. | |
| 2007/0019341 A1 | 1/2007 | Mizuno et al. | |
| 2007/0044370 A1 | 3/2007 | Shoji | |
| 2007/0063237 A1 | 3/2007 | Huai et al. | |
| 2007/0064350 A1 | 3/2007 | Gill | |
| 2007/0076332 A1 | 4/2007 | Shoji et al. | |
| 2007/0164734 A1 | 7/2007 | Shimizu et al. | |
| 2007/0230067 A1 | 10/2007 | Jogo et al. | |
| 2007/0230068 A1 | 10/2007 | Gill | |
| 2008/0031035 A1 | 2/2008 | Rodmaco et al. | |
| 2008/0098167 A1 | 4/2008 | Rodmaco et al. | |
| 2008/0151615 A1 | 6/2008 | Rodmacq et al. | |
| 2008/0316655 A1 | 12/2008 | Shoji | |
| 2009/0015972 A1 | 1/2009 | Dieny et al. | |
| 2009/0021249 A1 | 1/2009 | Kumar et al. | |
| 2009/0087589 A1 | 4/2009 | Guo et al. | |
| 2009/0115405 A1* | 5/2009 | Guo | G01D 5/145 427/598 |
| 2009/0189601 A1 | 7/2009 | Okada et al. | |
| 2009/0192755 A1 | 7/2009 | Sheiretov et al. | |
| 2009/0206831 A1 | 8/2009 | Fermon et al. | |
| 2009/0289694 A1 | 11/2009 | Rieger et al. | |
| 2009/0290053 A1 | 11/2009 | Hammerschmidt | |
| 2010/0027168 A1 | 2/2010 | Chou et al. | |
| 2010/0039734 A1 | 2/2010 | Hara et al. | |
| 2010/0045277 A1 | 2/2010 | Goldfine et al. | |
| 2010/0060263 A1 | 3/2010 | Granig et al. | |
| 2010/0149689 A1 | 6/2010 | Tsuchiya et al. | |
| 2011/0025320 A1 | 2/2011 | Ohta et al. | |
| 2011/0068786 A1 | 3/2011 | Miura et al. | |
| 2011/0133728 A1 | 6/2011 | Tokunaga | |
| 2011/0140217 A1 | 6/2011 | Nguyen et al. | |
| 2016/0260895 A1* | 9/2016 | Whig | G01R 33/093 |
| 2019/0086447 A1* | 3/2019 | Takano | G01R 33/0076 |
| 2020/0041310 A1* | 2/2020 | Lassalle-Balier | G01R 33/093 |
| 2022/0393554 A1* | 12/2022 | Binder | G01R 33/075 |
| 2023/0258741 A1* | 8/2023 | Lin | G01R 33/0011 324/225 |

FOREIGN PATENT DOCUMENTS

| | | |
|---|---|---|
| DE | 19 810 838 | 9/1999 |
| DE | 19 843 348 | 3/2000 |
| DE | 10 222 467 | 12/2003 |
| DE | 10 257 253 | 2/2004 |
| DE | 10 2005 024 879 | 12/2006 |
| DE | 10 2005 042 307 | 3/2007 |
| DE | 10 2006 019 483 | 10/2007 |
| DE | 10 2008 030 334 | 1/2010 |
| EP | 0 779 632 | 6/1997 |
| EP | 0 863 406 | 9/1998 |
| EP | 1 323 856 | 7/2003 |
| EP | 1 510 787 | 3/2005 |
| EP | 1 617 472 | 1/2006 |
| EP | 1 666 894 | 6/2006 |
| EP | 1 672 321 | 6/2006 |
| EP | 1 777 440 | 4/2007 |
| EP | 1 918 678 | 5/2008 |
| EP | 1 947 469 | 7/2008 |
| FR | 2 727 778 | 6/1996 |
| FR | 2 729 790 | 7/1996 |
| FR | 2 752 302 | 2/1998 |
| FR | 2 773 395 | 7/1999 |
| FR | 2 774 774 | 8/1999 |
| FR | 2 814 592 | 3/2002 |
| FR | 2 817 998 | 6/2002 |
| FR | 2 817 999 | 6/2002 |
| FR | 2 830 621 | 4/2003 |
| FR | 2 876 800 | 4/2006 |
| FR | 2 889 348 | 2/2007 |

(56) References Cited

FOREIGN PATENT DOCUMENTS

| | | |
|---|---|---|
| FR | 2 932 315 | 12/2009 |
| JP | 2000-055997 | 2/2000 |
| JP | 2000-055999 | 2/2000 |
| JP | 2000-056000 | 2/2000 |
| JP | 2001-230471 | 8/2001 |
| JP | 2002-082136 | 3/2002 |
| JP | 2002-267692 | 9/2002 |
| JP | 2002-328140 | 11/2002 |
| JP | 2003-174217 A | 6/2003 |
| JP | 2003-315091 | 11/2003 |
| JP | 2006-179566 A | 7/2006 |
| JP | 2006-214091 | 8/2006 |
| JP | 2007-101253 | 4/2007 |
| JP | 2007-108069 | 4/2007 |
| JP | 2009-014544 | 1/2009 |
| KR | 2006-0125913 A | 12/2006 |
| WO | WO 94/15223 | 7/1994 |
| WO | WO 01/67460 A1 | 9/2001 |
| WO | WO 2001/067085 | 9/2001 |
| WO | WO 2002/084680 | 10/2002 |
| WO | WO 2003/032338 | 4/2003 |
| WO | WO 2003/104829 | 12/2003 |
| WO | WO 2003/107018 | 12/2003 |
| WO | WO 2004/048986 | 6/2004 |
| WO | WO 2004/068152 | 8/2004 |
| WO | WO 2004/068158 | 8/2004 |
| WO | WO 2005/020242 | 3/2005 |
| WO | WO 2005/028993 | 3/2005 |
| WO | WO 2006/136577 | 12/2006 |
| WO | WO 2007/095971 | 8/2007 |
| WO | WO 2007/148028 | 12/2007 |
| WO | WO 2007/148029 | 12/2007 |
| WO | WO 2008/012309 | 1/2008 |
| WO | WO 2008/015354 | 2/2008 |
| WO | WO 2009/001160 | 12/2008 |
| WO | WO 2009/001162 | 12/2008 |
| WO | WO 2009/007324 | 1/2009 |
| WO | WO 2009/110892 | 9/2009 |
| WO | WO 2010/001077 | 1/2010 |
| WO | WO 2010/026948 | 3/2010 |
| WO | WO 2010/066976 | 6/2010 |
| WO | WO 2010/084165 | 7/2010 |
| WO | WO 2010/113820 | 10/2010 |
| WO | WO 2010/116102 | 10/2010 |
| WO | WO 2011/007767 | 1/2011 |
| WO | WO 2010/136527 | 12/2012 |

OTHER PUBLICATIONS

Coehoorn, Lecture Notes; "Chapter 2: Structure and Transport Properties of Conventional and Advanced Spin-Valves;" from *Novel Magnetoelectronic Materials and Devices*; Jan. 2003; pp. 33-84; 52 Pages.
Fermon et al.; "Optimised GMR Sensors for Low and High Frequencies Applications;" Elsevier, Sensors and Actuators, Jan. 2006; 4 pages.
Noziéres et al.; "Blocking Temperature Distribution and Long-Term Stability of Spin-Vavle Structures with Mn-Based Antiferromagnets;" Journal of Applied Physics, vol. 87, No. 8; Apr. 15, 2000; pp. 3920-3925; 6 Pages.
Office Action/Restriction Requirement dated Apr. 20, 2015; for U.S. Appl. No. 14/529,564; 9 pages.
Response filed Apr. 28, 2015; to Office Action/Restriction Requirement dated Apr. 20, 2015; for U.S. Appl. No. 14/529,564; 1 page.
Non-Final Office Action dated Jun. 17, 2015; for U.S. Appl. No. 14/529,564; 26 pages.
Response filed on Nov. 17, 2015 to Non-Final Office Action dated Jun. 17, 2015; For U.S. Appl. No. 14/529,564; 19 pages.
Final Office Action dated Feb. 4, 2016; U.S. Appl. No. 14/529,564; 24 pages.
Response filed on Apr. 29, 2016 to Final Office Action dated Feb. 4, 2016; For U.S. Appl. No. 14/529,564; 17 pages.
Request for Continued Examination filed on May 26, 2016; For U.S. Appl. No. 14/529,564; 3 pages.
Non-Final Office Action dated Jun. 23, 2016; For U.S. Appl. No. 14/529,564; 17 pages.
Response filed on Sep. 12, 2016; to Office Action dated Jun. 23, 2016 for U.S. Appl. No. 14/255,166; 25 pages.
PCT Search Report and Written Opinion of the ISA dated Jun. 2, 2015; for PCT Pat. App. No. PCT/US2015/010417; 13 pages.
PCT Search Report and Written Opinion of the ISA dated Jun. 2, 2015; for PCT Pat. App. No. PCT/US2015/010422; 12 pages.
PCT International Search Report and Written Opinion dated Aug. 10, 2016 corresponding to International Application No. PCT/US2016/034237; 21 Pages.
PCT International Preliminary Report on Patentability and Written Opinion dated Jul. 21, 2016 corresponding to International Application No. PCT/US2015/010422; 9 Pages.
U.S. Restriction Requirement dated Oct. 1, 2015 for U.S. Appl. No. 14/452,783; 8 Pages.
Response to U.S. Restriction Requirement dated Oct. 1, 2015 for U.S. Appl. No. 14/452,783; Response filed Nov. 20, 2015; 1 Page.
U.S. Non-Final Office Action dated Dec. 31, 2015 for U.S. Appl. No. 14/452,783; 14 Pages.
Response to U.S. Non-Final Office Action dated Dec. 31, 2015 for U.S. Appl. No. 14/452,783; Response filed Apr. 20, 2016; 13 Pages.
U.S. $1^{st}$ Notice of Allowance dated Jul. 6, 2016 for U.S. Appl. No. 14/452,783; 10 Pages.
U.S. $2^{nd}$ Notice of Allowance dated Oct. 7, 2016 for U.S. Appl. No. 14/452,783; 9 Pages.
European Intention to Grant dated Jul. 26, 2019 for European Application No. 15701862.3; 7 Pages.
Japanese $1^{st}$ Office Action (with Machine English Translation) dated Dec. 11, 2018 for Japanese Application No. 2016-545809; 17 Pages.
Response (with Machine English Translation) to Japanese Office Action dated Dec. 11, 2018 for Japanese Application No. 2016-545809; Response filed Feb. 19, 2019; 21 Pages.
Japanese $2^{nd}$ Office Action (with Machine English Translation) dated Jun. 4, 2019 for Japanese Application No. 2016-545809; 17 Pages.
Response (with Machine English Translation) to Japanese $2^{nd}$ Office Action dated Jun. 4, 2019 for Japanese Application No. 2016-545809; Response filed Aug. 30, 2019; 17 Pages.
Japanese Decision to Grant (with Machine English Translation) dated Sep. 30, 2019 for Japanese Application No. 2016-545809; 11 Pages.
Korean $1^{st}$ Office Action (with Machine English Translation) dated Nov. 24, 2020 for Korean Application No. 10-2016-7021481; 15 Pages.
Response (with Machine English Translation) to Korean $1^{st}$ Office Action dated Nov. 24, 2020 for Korean Application No. 10-2016-7021481; Response filed Jan. 21, 2021; 80 Pages.
Korean $2^{nd}$ Office Action (with Machine English Translation) dated May 27, 2021 for Korean Application No. 10-2016-7021481; 8 Pages.
Response (with Machine English Translation) to Korean $2^{nd}$ Office Action dated May 27, 2021 for Korean Application No. 10-2016-7021481; Response filed Jul. 26, 2021; 65 Pages.
Korean Notice of Allowance (with Machine English Translation) dated Nov. 22, 2021 for Korean Application No. 10-2016-7021481; 10 Pages.

\* cited by examiner

REDUCING ANGLE ERROR IN ANGLE SENSOR DUE TO ORTHOGONALITY DRIFT OVER MAGNETIC-FIELD

BACKGROUND

A magnetic-field sensing element is used to describe a variety of electronic elements that can sense a magnetic field. The magnetic-field sensing element can be, but is not limited to, a Hall Effect element, a magnetoresistance (MR) element, or a magnetotransistor. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

A magnetic-field angle sensor includes one or more magnetic-field sensing elements. In one example, the magnetic-field sensor includes at least two bridges. One bridge is a cosine bridge used to sense changes in a magnetic field in an x-direction. Another bridge is a sine bridge used to sense changes in a magnetic field in a y-direction and the sine bridge is orthogonal to the cosine bridge. In one example, the cosine bridge and the sine bridge each includes at least four MR elements. Any deviation from the orthogonal orientation between the cosine and sine bridges contributes to angle error. Angle errors due to orthogonality drift have been found to be larger as the magnetic field is reduced.

SUMMARY

In one aspect, a method includes manufacturing a magnetic-field angle sensor on a wafer. The manufacturing includes forming a cosine bridge that includes forming a first magnetoresistance (MR) element. The manufacturing also includes forming a sine bridge that includes forming a second MR element. Forming the first MR element includes using a process to reduce orthogonality errors between the sine bridge and the cosine bridge caused by anisotropy present in magnetic material in the first MR element.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate an angle sensor with reduced angle errors than angle sensors fabricated using traditional angle sensor fabrication. The techniques described herein reduce angle errors from orthogonality drift (between a sine bridge and cosine bridge) over a magnetic field caused by anisotropy present in magnetic material (antiferromagnetic material and ferromagnetic material).

Figure 1:
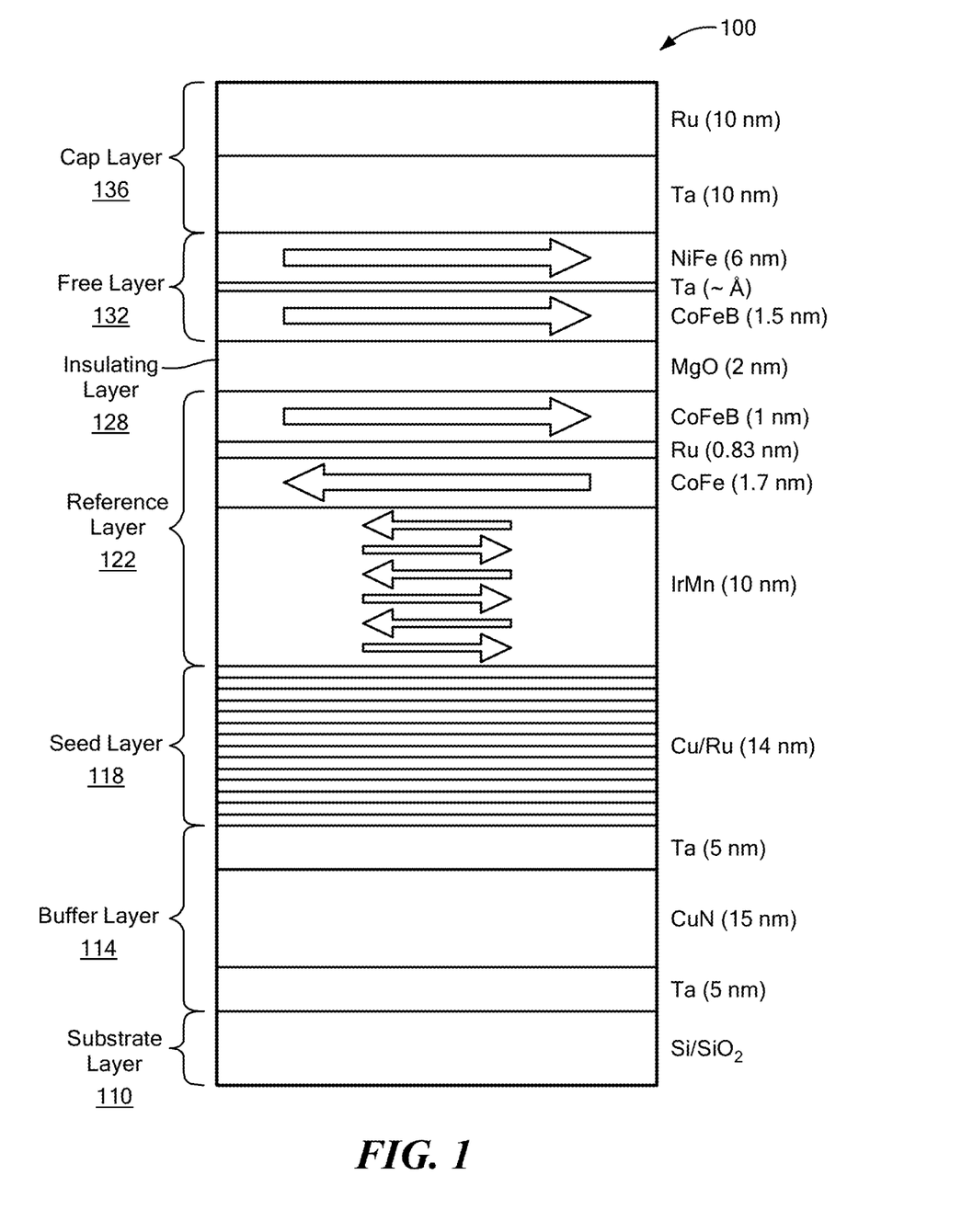
FIG. 1 is a block diagram of an example of a magnetoresistance (MR) element used in an angle sensor.

Referring to FIG. 1, an example of a magnetoresistance (MR) element used in an angle sensor is a MR element 100. In this particular example, the MR element is an example of a tunneling magnetoresistance (TMR) element. In other examples, the MR element may be a giant magnetoresistance (GMR) element.

The MR element 100 is arranged in a stack of layers. The MR element 100 includes a substrate layer 110; a buffer layer 114 on the substrate layer 110; a seed layer 118 on the buffer layer 114; a reference layer 122 on the seed layer 118; an insulator layer 128 on the reference layer 122; a free layer 132 on the insulator layer 128; and a cap layer 136 on the free layer 132.

In one example the substrate layer 110 is silicon wafer with silicon dioxide on the surface of the wafer. In one example the buffer layer 114 includes a first layer of tantalum on the substrate layer 110; a layer of copper nitride on the first layer of tantalum; and a second layer of tantalum on the layer copper nitride layer. In one example, the first and second tantalum layers are each about 5 nm±1 nm thick. The layer of copper nitride is about 15 nm±3 nm thick.

In one example, the seed layer 118 includes alternating layers of ruthenium and copper. In one example, the seed layer is about 14 nm±3 nm thick.

In one example, the reference layer 122 includes a layer of iridium manganese on the seed layer 118; a layer of cobalt iron on the layer of iridium manganese layer; a layer of ruthenium on the layer of cobalt iron; and a layer of cobalt iron boron on the layer of ruthenium. The layer of iridium manganese layer is an antiferromagnetic material and a pinning layer.

The layer of cobalt iron layer is a ferromagnetic material and in some examples is a pinned layer. The layer of ruthenium is a non-magnetic layer and acts as a spacer. The free layer 132 includes a ferromagnetic material (e.g., nickel iron and cobalt iron boron).

In one example, the layer of iridium manganese is about 10 nm±2 nm thick. In one example, the layer of cobalt iron is about 1.7 nm±0.1 nm thick. In one example, the layer of ruthenium is about 0.83 nm±0.01 nm thick. In one example, the layer of cobalt iron boron is about 1 nm±0.1 nm thick.

In one example, the insulator layer 128 is magnesium oxide. In one example, the magnesium oxide is 2 nm±0.1 nm thick.

In one example, the free layer 132 includes a layer of cobalt iron boron on the insulator layer 128; a layer of tantalum on the layer of cobalt iron boron; and a layer of nickel iron on the layer of tantalum. In one example, the layer of cobalt iron is about 1.5 nm±0.1 nm thick. In one example, the layer of tantalum is about an Angstrom thick. In one example, the layer of nickel iron is about 6 nm±0.1 nm thick.

In one example, the cap layer 136 includes a layer of tantalum on the free layer 132; and a layer of ruthenium layer on the layer of tantalum. In one example, the layer of tantalum is about 10 nm±2 nm thick. In one example, the layer of ruthenium is about 10 nm±2 nm thick.

One way to reduce the effects of anisotropy present in antiferromagnetic material and ferromagnetic material is to rotate the substrate during multiple depositions of a layer of antiferromagnetic or ferromagnetic material. For example, after a fraction of material of a layer of magnetic material is deposited, the wafer is rotated, and another fraction of material of the layer of the magnetic material is deposited. The rotation of the wafer and the fractional material deposition continues until the desired thickness of the layer is achieved. This deposition and wafer rotation process is applied to one or more of the magnetic layers in the MR element (e.g., the MR element 100 (FIG. 1)). In one example, after 1/n of the total material of a layer is deposited, the wafer is rotated 360°/n, where n is an integer greater than 1 and n indicates the number of depositions of the material.

Figure 2:
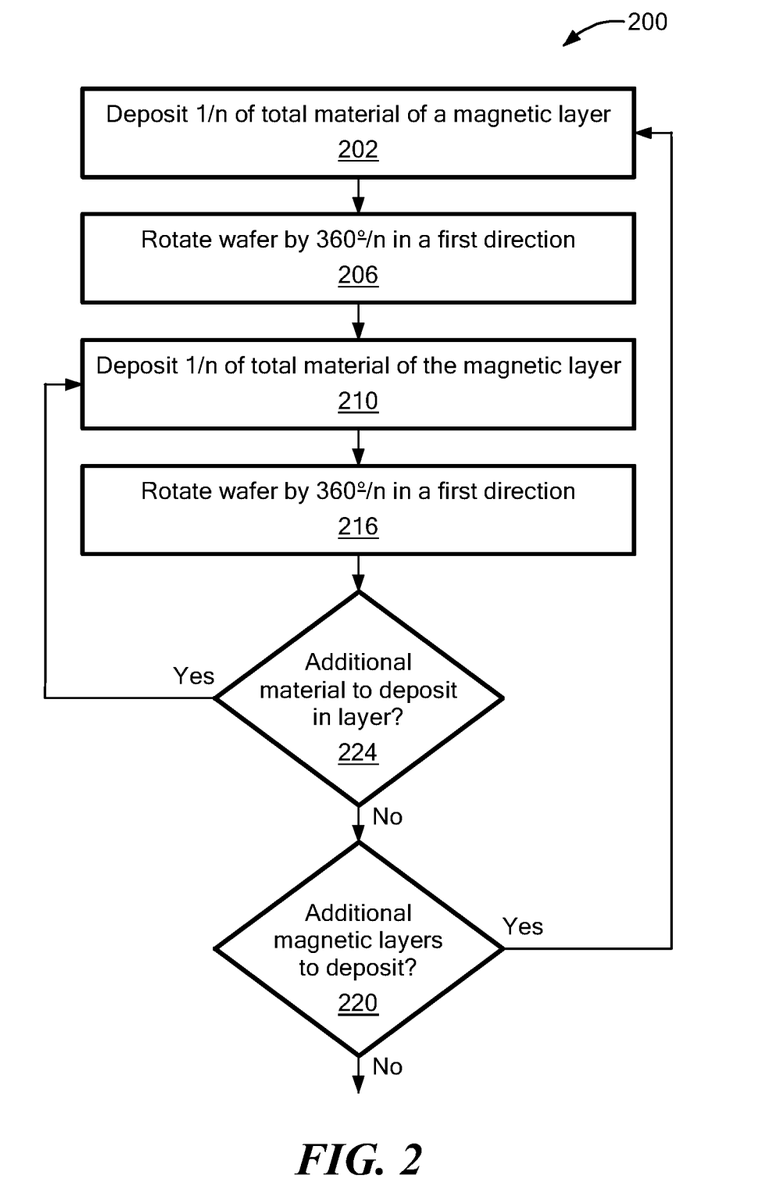
FIG. 2 is a flowchart of an example of a process used to fabricate an angle sensor with reduced angle errors due to orthogonality drift over a magnetic field.

Referring to FIG. 2, an example of a process used to fabricate an angle sensor with reduced angle errors due to orthogonality drift over a magnetic field is a process 200. Process 200 is an example of a process to reduce the effects of anisotropy present in antiferromagnetic material and ferromagnetic material.

Process 200 deposits 1/n of the total material of a magnetic layer (202). In one example, the magnetic layer is a ferromagnetic layer or antiferromagnetic layer such as, for example, one of the layers of the free layer 132 (e.g., the layer of nickel iron or the layer of cobalt iron boron (FIG. 1)) or one of the layers of the reference layer 122 (the layer of iridium manganese, the layer of cobalt iron boron or the layer of cobalt iron (FIG. 1)).

Figure 3A:
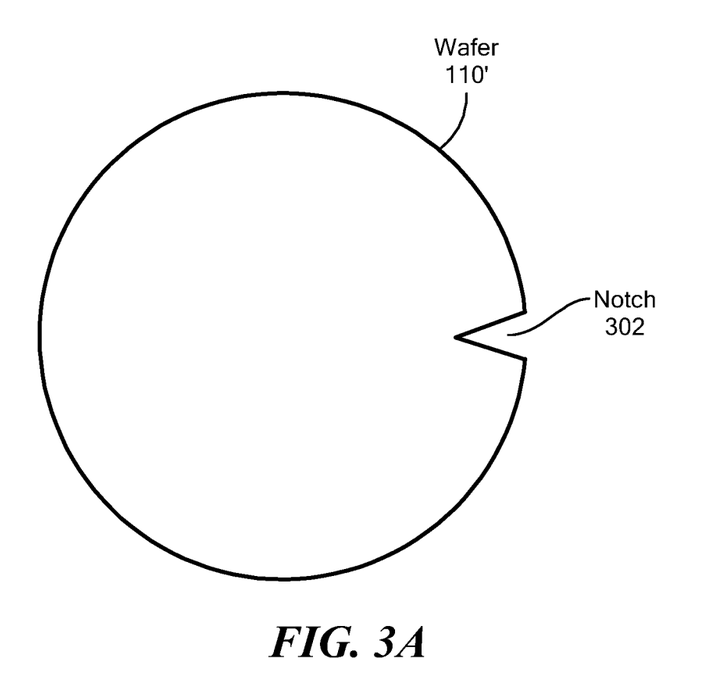
FIGS. 3A to 3D are particular examples of diagrams depicting wafer orientations for four depositions of antiferromagnetic material and ferromagnetic material.
Figure 3B:
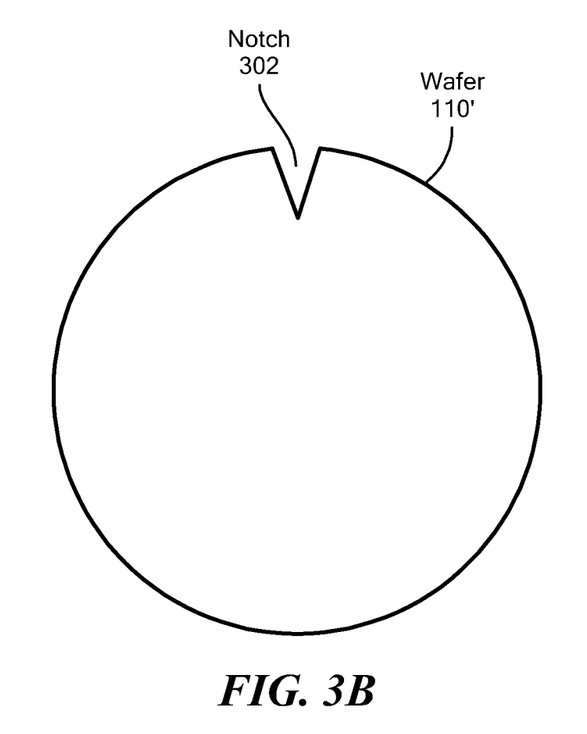

Process 200 rotates wafer 360°/n in a first direction (206). In one example, the first direction is counter-clockwise. In another example, the first direction is clockwise. In one example, n=4 and a wafer 110' is rotated 90° as depicted from FIG. 3A to FIG. 3B, which is shown by a notch 302 that rotates in counterclockwise direction 90° degrees. In one example, the wafer 110' is the substrate layer 110 (FIG. 1).

Figure 3C:
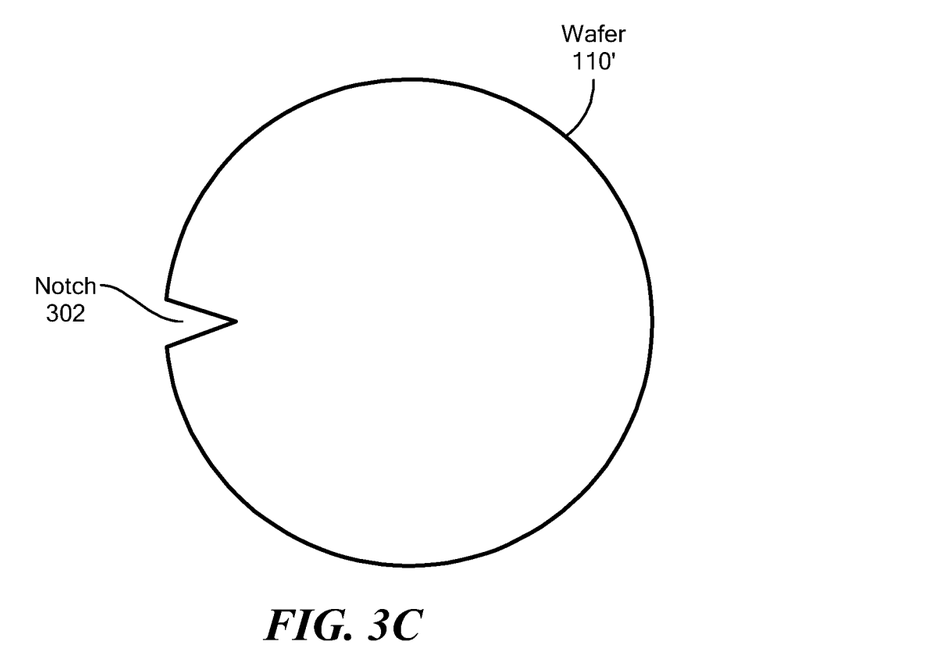

Process 200 deposits 1/n of the total material of the magnetic layer (210) and process 200 rotates the wafer 360°. In one example, n=4 and ¼ of the total material of the magnetic layer is deposited and the wafer 110' is rotated 90° as depicted by the notch 302 rotating in counterclockwise direction 90° degrees from FIG. 3B to FIG. 3C.

Figure 3D:
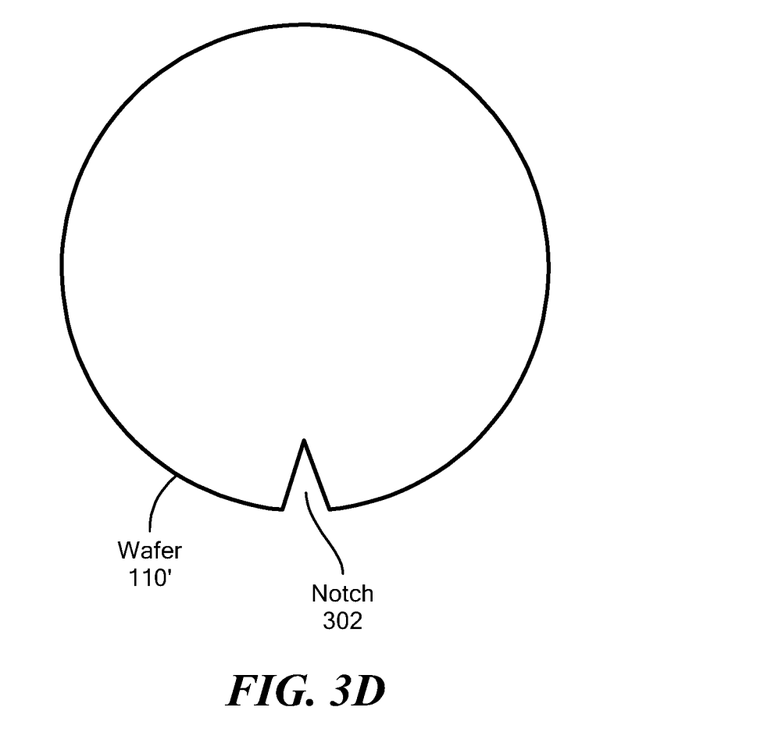

Process 200 determines if there are additional material to deposit in the magnetic layer (224) and if there is additional material to be deposited, process 200 repeats processing blocks 210 and 216 until the desired thickness of the magnetic layer is obtained. For example, when n=4, process 200 deposits another ¼ of the total material of the magnetic layer and rotates the wafer 110' 90° as shown from FIG. 3C to FIG. 3. Then, process 200 deposits the last deposit of the ¼ of the total material of the magnetic layer and rotates the wafer 110' 90° as shown from FIG. 3C to FIG. 3D.

Figure 4A:
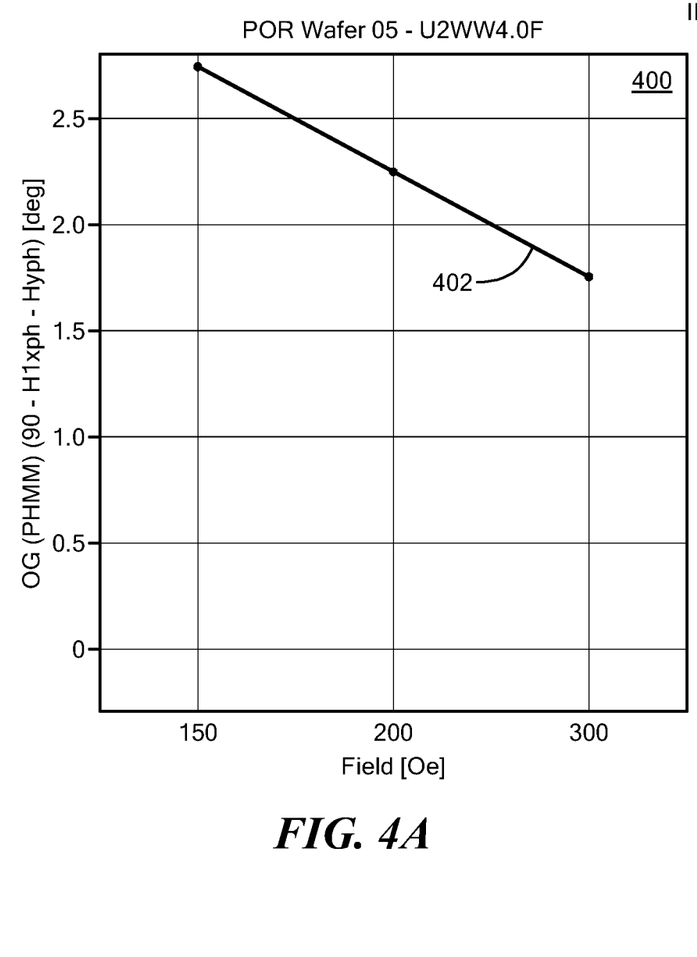
FIG. 4A is graph of an example of angle error without using the process in FIG. 2.
Figure 4B:
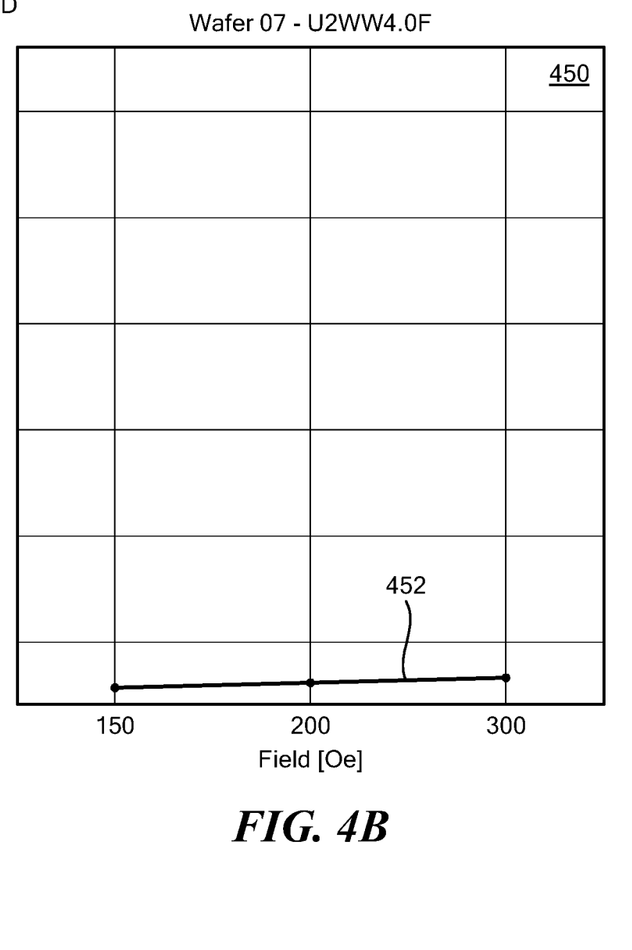
FIG. 4B is graph of an example of angle error using the process in FIG. 2.

Referring to FIGS. 4A & 4B, process 200 provides a significant improvement in reducing orthogonality errors than the prior art processes. A graph 400 shows a curve 402 that depicts orthogonality errors without using the process 200 where the orthogonality error is greater than 2.25° for a magnetic field less than 300 Oersted (Oe). A graph 450 shows a curve 452 that depicts orthogonality errors using the process 200 which are significantly lower than the prior art shown in FIG. 4A, where the graph 450 shows orthogonality errors less than 0.25° for a magnetic-field less than 300 Oe.

Figure 5:
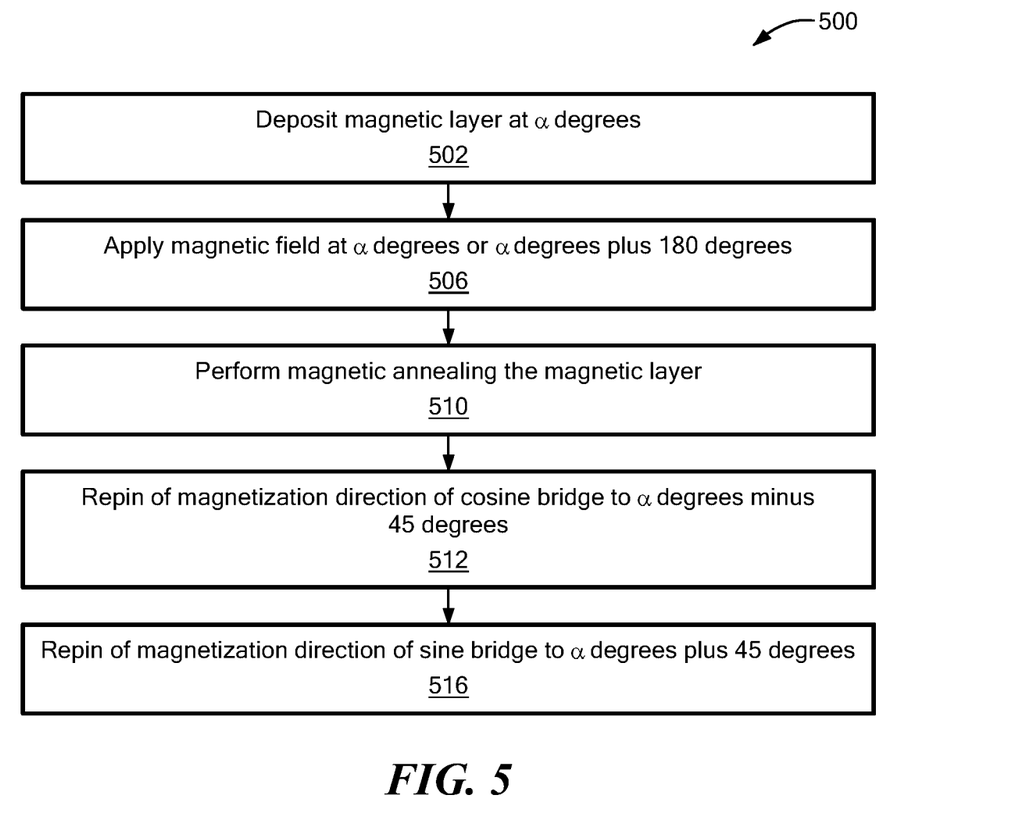
FIG. 5 is a flowchart of another example of a process used to fabricate the angle sensor with reduced angle errors due to orthogonality drift over a magnetic field.

Referring to FIG. 5, another example of a process used to fabricate an angle sensor with reduced angle errors due to orthogonality drift over a magnetic field is a process 500. Process 500 is another example of a process to reduce the effects of anisotropy present in antiferromagnetic material and ferromagnetic material.

Process 500 deposits a magnetic layer at $\alpha$ degrees (502). In one example, the $\alpha$ degrees is 45° from the notch 302 shown in FIG. 6 that depicts a deposition direction 602.

Figure 6:
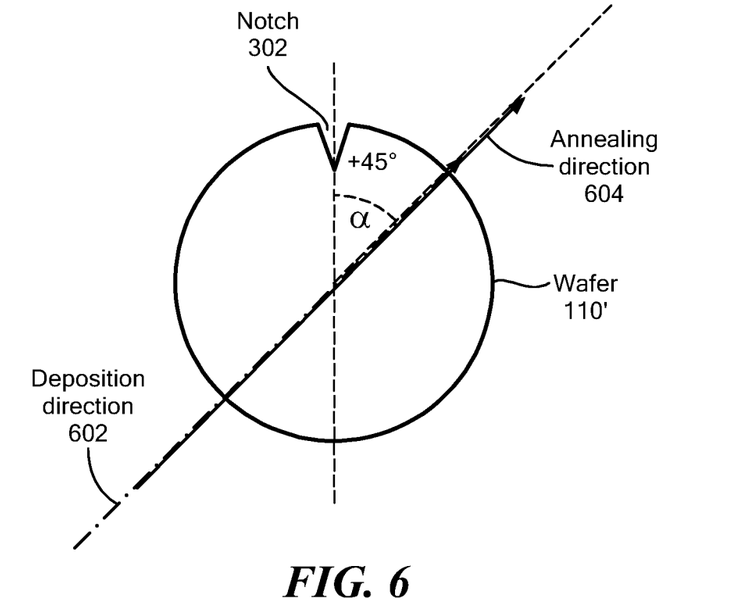
FIG. 6 is a diagram of an example of wafer orientation during material deposition and annealing.

Process 500 applies a magnetic field at $\alpha$ degrees or $\alpha$ plus 180° (506) and performs magnetic annealing on the magnetic layer (510). For example, a magnetic field is applied in an annealing direction 604 45° from the notch 302 (FIG. 6). In another example, an annealing direction 604 may be 45°+180° or 225° since anisotropy in a magnetic material is uniaxial and not unidirectional.

Process 500 re-pins the magnetization direction of a sine bridge to $\alpha$ degrees minus 45° (512). For example, the MR elements in a sine bridge would each be re-pinned to zero degrees.

Process 500 re-pins the magnetization direction of a cosine bridge to $\alpha$ degrees plus 45° (516). For example, the MR elements in a cosine bridge would each be re-pinned to 90°.

Figure 7:
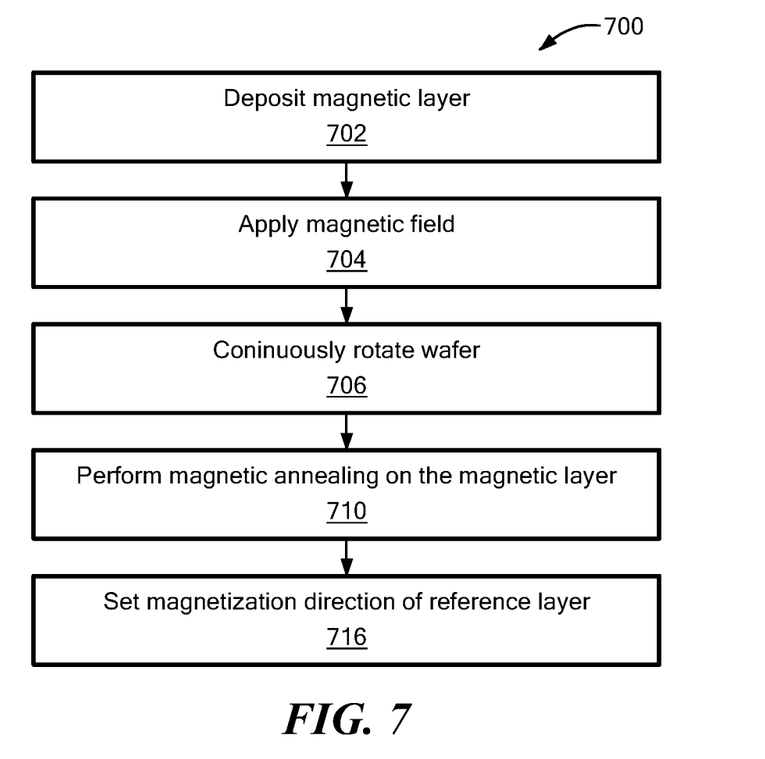
FIG. 7 is a flowchart of a further example of a process used to fabricate the angle sensor with reduced angle errors due to orthogonality drift over a magnetic field.

Referring to FIG. 7, a further example of a process used to fabricate an angle sensor with reduced angle errors due to orthogonality drift over a magnetic field is a process 700. Process 700 is a further example of a process to reduce the effects of anisotropy present in antiferromagnetic material and ferromagnetic material.

Process 700 deposits a magnetic layer (702). For example, ferromagnetic or antiferromagnetic material is deposited.

After process 700 deposits the magnetic layer, process 700 applies a magnetic field (704), continuously rotates a wafer (706) and performs magnetic annealing on the magnetic layer (710). For example, the wafer 110' (FIG. 1) is continuously rotated during a magnetic anneal in the presence of a stationary magnetic field, which will cause any presence of anisotropy from the magnetic layer to disappear. The magnetic field used for the anneal is a large field to overcome all grain orientations (i.e., grains present at the material interfaces as well as in bulk) and any anisotropy present in the system.

Process 700 sets magnetization direction of reference layer (716). Since there is no fixed direction after annealing, an additional anneal processing block is required to set the magnetic field orientation of the reference layer (e.g., the reference layer 122 (FIG. 1)). However, the anisotropy induced by deposition of the magnetic layer is erased because of the rotational anneal.

The processes described herein are not limited to the specific examples described. For example, the processes 200, 500 and 700 are not limited to the specific processing order of FIGS. 2, 5 and 7, respectively. Rather, any of the processing blocks of FIGS. 2, 5 and 7 may be re-ordered, combined, or removed, performed in parallel or in serial, as necessary, to achieve the results set forth above.

In some examples, one or more of the processes (e.g., processes 200, 500 and 700) may be combined. For example, the process 200 may be performed first followed by one or more of the processing blocks in the process 700.

One or more of the processes (e.g., processes 200, 500 and 700) may be used to form one or more MR elements in a sine bridge and/or a cosine bridge of an angle sensor. In one particular example, one or more of the processes (e.g., processes 200, 500 and 700) may be used to form all of the MR elements in a sine bridge and a cosine bridge of an angle sensor.

Having described preferred embodiments, which serve to illustrate various concepts, structures, and techniques, which are the subject of this patent, it will now become apparent to those of ordinary skill in the art that other embodiments incorporating these concepts, structures and techniques may be used.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method for manufacturing a magnetic field sensor, the method comprising:
    forming, on a substrate, a cosine bridge, the forming of the cosine bridge including forming a first magnetoresistance (MR) element, the first MR element being formed by: (i) depositing on the substrate 1/n of a total of a magnetic material of a first magnetic layer, (ii) rotating the substrate by 360°/n after depositing 1/n of the total of the magnetic material of magnetic layer, (iii) depositing on the substrate an additional 1/n of the total of the magnetic material of the first magnetic layer, (iv) rotating the substrate by 360°/n after depositing the additional 1/n of the total of the magnetic material of the first magnetic layer, wherein n is an integer greater than 2, and steps (iii), and (iv) are repeated until the total of the magnetic material of the first magnetic layer is deposited; and
    forming, on the substrate, a sine bridge, the forming of the sine bridge including forming a second MR element.

2. The method of claim 1, wherein:
    the second MR element is formed by: (v) depositing on the substrate 1/m of a total of a magnetic material of a second magnetic layer, (vi) rotating the substrate by 360°/m after depositing 1/m of the total of the magnetic material of the second magnetic layer, and (vii) depositing on the substrate an additional 1/m of the total of the magnetic material of the second magnetic layer, (viii) rotating the substrate by 360°/m after depositing the additional 1/m of the total of the magnetic material of the second magnetic layer;
    m is an integer greater than 2, and
    steps (vii), and (viii) are repeated until the total of the magnetic material of the second magnetic layer is deposited.

3. The method of claim 1, further comprising rotating the substrate after the total of the magnetic material of the first magnetic layer is deposited and performing magnetic annealing on the first magnetic layer while the substrate is being rotated.

4. The method of claim 1, wherein the sine bridge and the cosine bridge each comprise at least four MR elements.

5. The method of claim 1, wherein the first MR element and/or the second MR element is a giant magnetoresistance (GMR) elements.

6. The method of claim 1, wherein the first MR element and/or the second MR element is a tunneling magnetoresistance (TMR) elements.

7. The method of claim 1, wherein the magnetic material is ferromagnetic material.

8. The method of claim 1, wherein the magnetic material is antiferromagnetic material.

9. A method for manufacturing a magnetic field sensor, the method comprising:
    forming, on a substrate, a cosine bridge, the forming of the cosine bridge including forming a first magnetoresistance (MR) element, the first MR element being formed by: (i) depositing on the substrate 1/n of a total of a magnetic material of a first magnetic layer, (ii) rotating the substrate by a first predetermined angular distance after depositing 1/n of the total of the magnetic material of the first magnetic layer, (iii) depositing on the substrate an additional 1/n of the total of the magnetic material of the first magnetic layer, (iv) rotating the substrate by the first predetermined angular distance after depositing the additional 1/n of the total of the magnetic material of the first magnetic layer, wherein n is an integer greater than 2, the first predetermined angular distance is less than 360 degrees, and steps (iii), and (iv) are repeated until the total of the magnetic material of the first magnetic layer is deposited; and
    forming, on the substrate, a sine bridge, the forming of the sine bridge including forming a second MR element.

10. The method of claim 9, further comprising rotating the substrate after the total of the magnetic material of the first magnetic layer is deposited and performing magnetic annealing on the first magnetic layer while the substrate is being rotated.

11. The method of claim 9, wherein the first MR element and/or the second MR element is a giant magnetoresistance (GMR) elements.

12. The method of claim 9, wherein the first MR element and/or the second MR element is a tunneling magnetoresistance (TMR) elements.

13. The method of claim 9, wherein the magnetic material is ferromagnetic material.

14. The method of claim 9, wherein the magnetic material is antiferromagnetic material.

15. The method of claim 9, wherein:
    the second MR element is formed by: (v) depositing on the substrate 1/m of a total of a magnetic material of a second magnetic layer, (vi) rotating the substrate by a second predetermined angular distance after depositing 1/m of the total of the magnetic material of the second magnetic layer, and (vii) depositing on the substrate an additional 1/m of the total of the magnetic material of the second magnetic layer, (viii) rotating the substrate by the second predetermined angular distance after depositing the additional 1/m of the total of the magnetic material of the second magnetic layer,
    m is an integer greater than 2,
    the second predetermined angular distance is less than 360 degrees; and
    steps (vii), and (viii) are repeated until the total of the magnetic material of the second magnetic layer is deposited.

16. A method for manufacturing a magnetic field sensor, the method comprising:
- forming, on a substrate, a cosine bridge, the forming of the cosine bridge including forming a first magnetoresistance (MR) element the first MR element being formed by: depositing on the substrate a magnetic material of a first magnetic layer, rotating the substrate after depositing the magnetic material of the first magnetic layer, performing magnetic annealing of the first magnetic layer while the substrate is rotating, and setting a magnetization direction of a reference layer of the first MR element after the magnetic annealing is completed; and
- forming, on the substrate, a sine bridge, the forming of the sine bridge including forming a second MR element.

17. The method of claim 16, wherein the first MR element and/or the second MR element is a giant magnetoresistance (GMR) elements.

18. The method of claim 16, wherein the first MR element and/or the second MR element is a tunneling magnetoresistance (TMR) elements.

* * * * *